(12) United States Patent
Cao Minh et al.

(10) Patent No.: US 10,718,701 B2
(45) Date of Patent: Jul. 21, 2020

(54) NMR BASED RESERVOIR WETTABILITY MEASUREMENTS

(71) Applicant: Schlumberger Technology Corporation, Sugar Land, TX (US)

(72) Inventors: Chanh Cao Minh, Katy, TX (US); Steve Crary, Al-Khobar (SA); Philip M. Singer, Richmond, TX (US); Andrea Valori, Al-Khobar (SA); Henry N. Bachman, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 568 days.

(21) Appl. No.: 15/147,298

(22) Filed: May 5, 2016

(65) Prior Publication Data

US 2016/0334346 A1 Nov. 17, 2016

Related U.S. Application Data

(60) Provisional application No. 62/160,391, filed on May 12, 2015.

(51) Int. Cl.
*G01V 3/32* (2006.01)
*G01N 13/00* (2006.01)
*G01V 3/38* (2006.01)
*G01R 33/44* (2006.01)

(52) U.S. Cl.
CPC ........... *G01N 13/00* (2013.01); *G01R 33/448* (2013.01); *G01V 3/32* (2013.01); *G01V 3/38* (2013.01)

(58) Field of Classification Search
CPC ...... G01V 3/32; G01N 24/081; Y02A 90/344; G01R 33/50
See application file for complete search history.

(56) References Cited

U.S. PATENT DOCUMENTS

| | | |
|---|---|---|
| 5,055,788 A | 10/1991 | Kleinberg et al. |
| 5,629,623 A | 5/1997 | Sezginer et al. |
| 6,570,382 B1 | 5/2003 | Hurlimann et al. |

(Continued)

FOREIGN PATENT DOCUMENTS

| | | | |
|---|---|---|---|
| WO | 2011091269 A2 | 7/2011 | |
| WO | WO 2011091269 | * 7/2011 | ............... G01V 3/32 |

OTHER PUBLICATIONS

International Search Report and Written Opinion issued in related PCT application PCT/US2016/031976 dated Aug. 16, 2016, 13 pages.

(Continued)

*Primary Examiner* — Alesa Allgood
(74) *Attorney, Agent, or Firm* — Trevor G. Grove

(57) ABSTRACT

A method for determining a wettability of a subterranean formation (or formation core) includes either deploying a nuclear magnetic resonance (NMR) logging tool in a subterranean wellbore or deploying a formation core sample in a laboratory based NMR tool. NMR measurements of the formation (or formation core) are obtained and used to compute the wettability. The NMR measurements are processed to generate a two dimensional diffusion relaxation map (a $D/T_2$ map) which is in turn processed to compute the wettability.

15 Claims, 7 Drawing Sheets
(5 of 7 Drawing Sheet(s) Filed in Color)

(56) References Cited

U.S. PATENT DOCUMENTS

| | | | |
|---|---|---|---|
| 6,969,913 | B2 | 11/2005 | Shirakawa et al. |
| 7,397,240 | B2* | 7/2008 | Fleury ............... G01N 15/0826 |
| | | | 324/303 |
| 7,500,388 | B2 | 3/2009 | Fujisawa et al. |
| 8,076,933 | B2 | 12/2011 | Freedman |
| 2003/0169040 | A1* | 9/2003 | Hurlimann ............. G01V 3/32 |
| | | | 324/303 |
| 2004/0000905 | A1 | 1/2004 | Freedman et al. |
| 2007/0132451 | A1 | 6/2007 | Ramakrishnan |
| 2012/0229135 | A1 | 9/2012 | Hurlimann et al. |
| 2013/0261979 | A1 | 10/2013 | Al-Muthana et al. |
| 2013/0325348 | A1 | 12/2013 | Valori et al. |

OTHER PUBLICATIONS

Al-Muthana, A. S., Hursan, G. G., Ma, S. M., Valori, A., Nicol, B., & Singer, P. M. 2012 Wettability as a function of pore size by NMR. SCA 2012 paper A0.13. (12 pages).

Amott, E., 1959, Observations Relating to the Wettability of Porous Rock, Trans. AIME, 216, pp. 156-162.

Anderson W. G., 1986-87, Wettability Literature Survey, Part 1: Rock/Oil/Brine Interactions and the effects of Core Handling on Wettability, Soc. Petrol. Engr. JPT, vol. 38-39 (20 pages).

Anderson W. G., 1986-87, Wettability Literature Survey, Part 2: Wettability Measurement, JSoc. Petrol. Engr. JPT, vol. 38-39 (17 pages).

Anderson W. G., 1986-87, Wettability Literature Survey, Part 3: The Effects of Wettability on the Electrical Properties of Porous Media, JSoc. Petrol. Engr. JPT, vol. 38-39 (8 pages).

Anderson W. G., 1986-87, Wettability Literature Survey, Part 4: Effects of Wettability on Capillary Pressure, JSoc. Petrol. Engr. JPT, vol. 38-39 (18 pages).

Anderson W. G., 1986-87, Wettability Literature Survey, Part 5: The Effects of Wettability on Relative Permeability, JSoc. Petrol. Engr. JPT, vol. 38-39 (16 pages).

Anderson W. G., 1986-87, Wettability Literature Survey, Part 6: The Effects of Wettability on Waterflooding, JSoc. Petrol. Engr. JPT, vol. 38-39 (18 pages).

Borgia, G. C., Fantazzini, P., and Mesini, E., 1991, Wettability Effects on Oil-Water Configurations in Porous Media: A Nuclear Magnetic Resonance Relaxation Study, J. Appl. Phys. (1991), 70 (12). (4 pages).

Brown R. J., and Fatt I., 1956, Measurement of Fractional Wettability of Oilfield Rocks by the Nuclear Magnetic Relaxation Method, Trans. AIME (1956), 207, pp. 262-264.

Minh, C., Heaton, N., Ramamoorthy, R., Decoster, E., White, J., Junk, E., Eyvazzadeh, R., Al-Yousef, O., Fiorini, Ro, Dacion, B. and McLendon, D. 2003 Planning and interpreting NMR fluid characterization logs. SPE paper 84478. (12 pages).

Minh, C., Crary, S., Zielinski, L., Liu, C.B. and Jones S., Jacobsen S. 2012, 2D-NMR applications in unconventional reservoirs. SPE paper 161578-PP. (17 pages).

Chen, J., Hirasaki, G. J., and Flaum, M., 2004, Study of Wettability Alteration from NMR: Effect of OBM on Wettability and NMR Responses, 8th International Symposium on Reservoir Wettability, May 16-18, 2004. (17 pages).

Clerke, E.A., Allen, D.F., Crary, S.F., Srivastava, A., Ramamoorthy, R., Saldungaray, P., Savundararaj, P., Heliot, D., Goswami, J., Bordakov, G. 2014 Wireline Spectral Porosity Analysis of the Arab limestone—from Rosetta Stone to Cipher. SPWLA 55th Annual Symposium. May 18-22, 2014 (23 pages).

Cockroft, P.J., Guise, D.R., and Waworuntu, I.D., 1989, The Effect of Wettability on Estimation of Reserves, SPE paper 19484. (10 pages).

Donaldson, E.C., Thomas, R.D., and Lorenz, P.B., 1969, Wettability Determination and its Effect on Recovery Efficiency, SPE Journal, March, pp. 13-20. (20 pages).

Desbrandes, R., 1987, In Situ Wettability Determination with Formation Pressure Data, Paper Z presented at the 28th SPWLA Annual Logging Symposium, Jun. 29-Jul. 2, 1987 (20 pages).

Elshahawi, H., Samir, M., and Fathy, K., 2000, Correcting for Wettability and Capillary Pressure Effects on Formation Tester Measurements, SPE paper 63075, Dallas, Texas, Oct. 1-4, 2000 (15 pages).

Freedman, R., Heaton, N., Flaum, M., Hirasaki, G. J., 2002, Wettability, Saturation, and Viscosity Using Magnetic Resonance Fluid Characterization Method and New Diffusion-Editing Pulse Sequences, SPE paper 77397, San Antonio, Texas, Sep. 29-Oct. 2, 2002 (13 pages).

Fleury, M., and Deflandre, F., 2003, Quantitative Evaluation of Porous Media Wettability Using NMR Relaxometry, Magnetic Resonance Imaging, 21, pp. 385-387.

Godefroy S., M. Fleury, F. Deflandre, J.P.Korb 2001, Temperature effect on NMR surface relaxation, SPE paper 71700, New Orleans, Louisiana, Sep. 30-Oct. 3, 2001 (13 pages).

Hürlimann, M., Helmer, K.G., Latour L.L., Sotak, C.H. 1994, "Restricted Diffusion in Sedimentary Rock: Determination of Surface-to-Volume Ratio and Surface Relaxivity", Journal Magnetic Resonance, Series A, 111:169-178.

Hürlimann, M. D., and Venkataramanan, L., 2002, Quantitative Measurement of Two-Dimensional Distribution Functions of Diffusion and Relaxation in Grossly Inhomogeneous Fields, Journal of Magnetic Resonance, 157, 31-42 (2002).

Jacobsen, S., Crary, S., Cao Minh, C., Singer, P.M., Zielinski, L. 2014 Determining Interpretation Parameters using 2D Magnetic Resonance Measurements. Poster WE P09 11 76th EAGE Conference and Exhibition, 2014, Amsterdam RAI, The Netherlands, Jun. 16-19, 2014 (5 pages).

Kausik, R., Cao Minh, C., Zielinski, L., Vissapragada, B., Akkurt, R., Song, Y.Q., Liu, C.B., Jones, S. and Blair, E. 2011 Characterization of gas dynamics in kerogen nanopores by NMR. SPE paper 147184, Denver, Colorado, USA, Oct. 30-Nov. 2, 2011 (16 pages).

Lewis, M.G., Sharma, M.M., and Dunlap, H.F., 1988, Wettability and Stress Effects on Saturation and Cementation Exponents, Paper K presented at the 29th SPWLA Annual Logging Symposium, Jun. 5-8, 1988 (24 pages).

Looyestijn, W. J. and Hofman, J. P., 2005, Wettability Index Determination by Nuclear Magnetic Resonance, SPE paper 93624, Bahrain, Mar. 12-15, 2005 (8 pages).

Looyestijn, W. and Hofman, J. 2006 Wettability-index determination by nuclear magnetic resonance. SPE Res Eval & Eng 9 (2) 146-153, Apr. 2006.

Looyestijn, W. J., 2008, Wettability Determination from NMR Logs, Petrophysics, 49(2), pp. 130-145.

Ma, S.M., Zhang, X., Morrow, N.R., and Zhou, X., 1999, Characterization of Wettability from Spontaneous Imbibition Measurements, Journal of Canadian Petroleum Technology, 38(13), paper 94-47 (8 pages).

Mitra, P., Sen, P., Schwartz, L., 1993, "Short time behavior of the Diffusion Coefficient as a Geometric probe of Porous Media", Physical Review B, 47:8565, Apr. 1, 1993, (10 pages).

Morrow, N.R., 1990, Wettability and its Effect on Oil Recovery, SPE Distinguished Author Series, JPT, 42, pp. 1476-1484.

Nguyen, B.L., Bruining, J., and Slob, E.C., 1999, Effects of Wettability on Dielectric Properties of Porous Media, SPE paper 56507, Houston, Texas, Oct. 3-6, 1999 (8 pages).

Okasha et al., 2007, Fifty Years of Wettability Measurements in the Arab-D Carbonate Reservoir, SPE Paper 105114, Kingdom of Bahrain, Mar. 11-14, 2007 (10 pages).

Owens, W. W. and Archer, D. L, 1971, The Effect of Rock Wettability on Oil-wet Relative Permeability Relationship, JPT (Jul. 1971), pp. 873-878.

Ryu, S. 2009, Effect of inhomogeneous surface relaxivity, pore geometry and internal field gradient on NMR logging: exact and perturbative theories and numerical investigations, SPWLA 50th Annual Logging Lymposium, Jun. 21-24, 2009 (pp. 16).

Staley, C., Morriss C. E., Kenyon W. E., and Howard J. J., 1995, NMR in Partially Saturated Sandstones: Laboratory Insights into Free Fluid Index, and Comparison with Borehole Logs, The Log Analyst, 36(1), Jan.-Feb. 1995, pp. 40-56.

(56) References Cited

OTHER PUBLICATIONS

Treiber, L.E., Archer, D.L., and Owens, W.W., 1972, A Laboratory Evaluation of the Wettability of Fifty Oil-Producing Reservoirs, SPE paper 5326, Jul. 26, 1971 (10 pages).
Zhang, G. Q., Huang, C. C., and Hirasaki, G. J., 2000, Interpretation of Wettability in sandstones with NMR Analysis, Petrophysics, 41(3), 223-233.
Zielinski, L., Ramamoorthy, R., Singer, P., Cao Minh, C., Daghar, K.A.A., Sayed, R.H. and Abdelaal, A.F. 2010 Restricted diffusion effects in saturation estimates from 2D diffusion-relaxation NMR maps. SPE paper 134841.
International Preliminary Report on Patentability issued in the related PCT application PCT/US2016/031976, dated Nov. 14, 2017 (9 pages).
Johnson, R.E. and Dettre, R.H., 1969, Wettability and Contact Angles, Surface and Colloid Science, E. Matijevic (ed.), Wiley Interscience, 2, pp. 85-153.
Einstein, Albert [1926], Investigation on the theory of the Brownian motion, Dover edition 1956 (11 pages).

\* cited by examiner

NMR BASED RESERVOIR WETTABILITY MEASUREMENTS

RELATED APPLICATIONS

This application claims the benefit of: U.S. Provisional Application Ser. No. 62/160,391 filed May 12, 2015 and entitled Determination of Wettability from Magnetic Relaxation and Diffusion Measurements.

FIELD OF THE INVENTION

The disclosed embodiments are related generally to subterranean formation evaluation using nuclear magnetic resonance (NMR) and more particularly to an NMR based method for determining reservoir wettability from magnetic resonance relaxation and diffusion measurements.

BACKGROUND

Wettability refers to the tendency of a solid to be in contact with one fluid rather than another. In wellbore drilling applications, the fluid phases may be water, oil, and/or gas while the solid phase may be the minerals that make up the reservoir rock. The wettability of reservoir rocks is known to affect the hydrocarbon distribution within a subterranean formation and impact many aspects of reservoir engineering such as hydrocarbon recovery, multiphase fluid flow, and formation pressure. Wettability may also affect formation resistivity and dielectric properties.

Reservoir wettability may be measured using conventional laboratory techniques, for example, Amott imbibition measurements or U.S. Bureau of Mines centrifuge capillary measurements may be made on formation cores (also referred to as plugs). While these techniques are industry recognized, they can be overly sensitive to numerous factors and are generally very time consuming (e.g., sometimes requiring many weeks to obtain a reliable wettability measurement). These measurement techniques also generally require significant sample conditioning (e.g., repeated cleansing, flushing, and rinsing) which is time consuming and may cast doubt on the obtained wettability values.

Nuclear magnetic resonance (NMR) measurements that derive wettability from one dimensional $T_1$ and/or $T_2$ spectra have also been disclosed (e.g., in commonly assigned U.S. Patent Publications 2013/0261979 and 2013/0325348). One challenge in using these 1-D NMR methods is that they tend to require accurate knowledge of bulk relaxation times and volumes (or $S_w$) for all fluids, the surface relaxivity, the pore size distribution, and the separation of individual fluid responses. These methods can also be time consuming in that they may further require multiple step data acquisition and extensive sample conditioning. Therefore, there remains a need in the art for improved wettability measurement techniques.

SUMMARY

A method for determining wettability of a subterranean formation (or a formation core) is disclosed. The disclosed method includes either deploying a nuclear magnetic resonance (NMR) logging tool in a subterranean wellbore or deploying a formation core sample in a laboratory based NMR tool. The NMR logging tool or laboratory based NMR tool includes a static magnetic field source and at least one radio frequency (RF) antenna. The RF antenna (or antennas) transmit(s) at least first and second electromagnetic pulse sequences into the subterranean formation and receives magnetic resonance signals corresponding to the transmitted electromagnetic pulse sequences. The received magnetic resonance signals are processed to generate a two dimensional diffusion relaxation map (a D/$T_2$ map) which is in turn processed to compute the wettability of the subterranean formation.

The disclosed embodiments may provide various technical advantages. For example, the disclosed embodiments may provide an NMR based methodology to determine formation wettability (e.g., a formation wettability index) of a subterranean formation or a formation core sample. Wettability measurements made using the disclosed embodiments may advantageously correlate with conventional measurements, for example, made using the U.S. Bureau of Mines methodology. Moreover the wettability measurements may be made using downhole NMR measurements or using NMR measurements made on fresh state formation core samples and require only a small fraction of the time required to obtain conventional measurements.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a more complete understanding of the disclosed embodiments, and advantages thereof, reference is now made to the following descriptions taken in conjunction with the accompanying drawings, in which.

DETAILED DESCRIPTION

Figure 1:
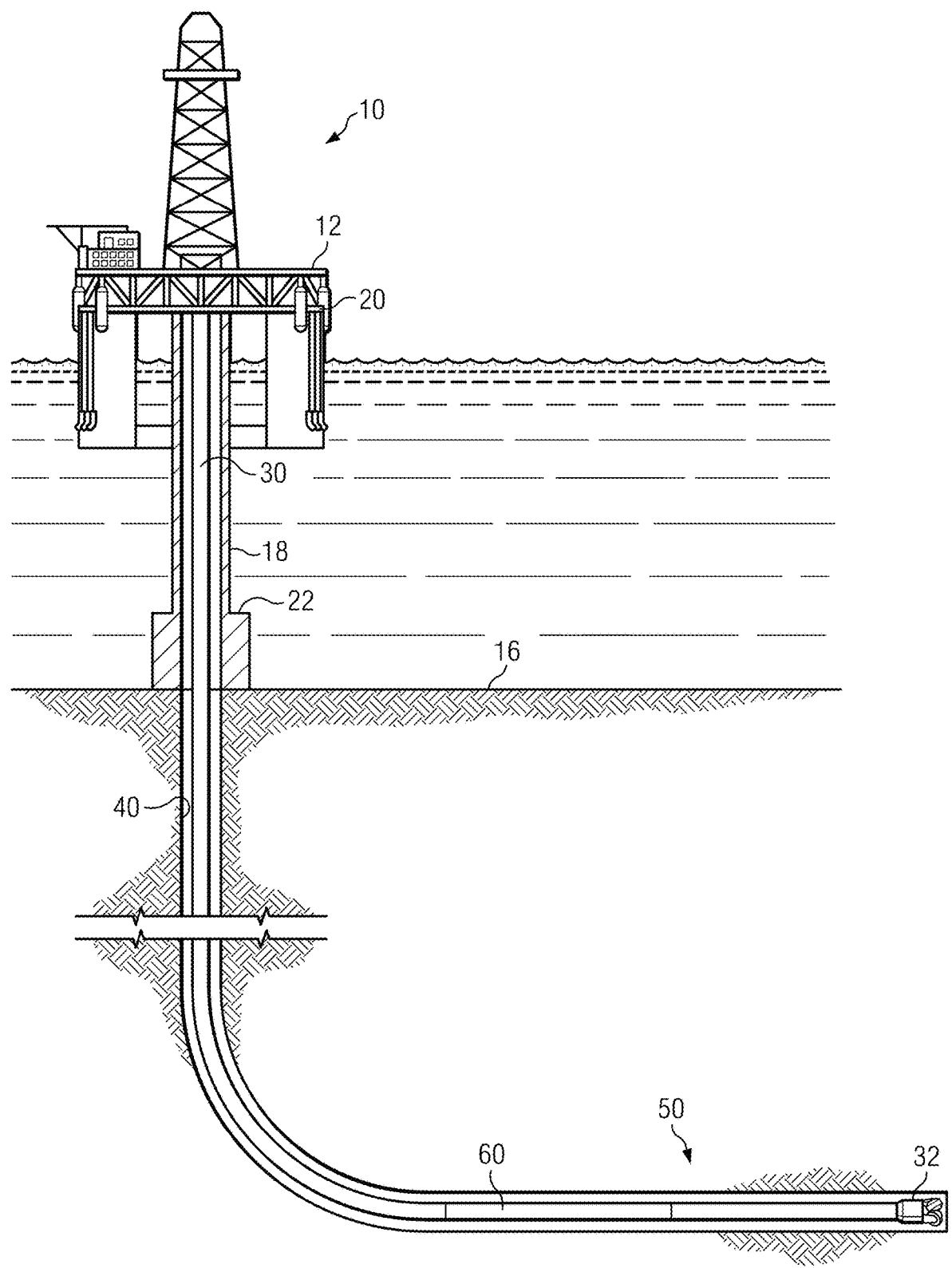
FIG. 1 depicts a drilling rig on which certain ones of the disclosed embodiments may be utilized.

FIG. 1 depicts one example of an offshore drilling assembly, generally denoted 10, that may be suitable for employing certain ones of the disclosed method embodiments. In FIG. 1 a semisubmersible drilling platform 12 is positioned over an oil or gas formation (not shown) disposed below the sea floor 16. A subsea conduit 18 extends from deck 20 of platform 12 to a wellhead installation 22. The platform may include a derrick and a hoisting apparatus for raising and lowering the drill string 30, which, as shown, extends into borehole 40. The drill string includes a bottom hole assembly (BHA) 50 having a drill bit 32 and a nuclear magnetic resonance (NMR) logging while drilling tool 60 which is described in more detail below with respect to FIG. 2. The BHA 50 may include substantially any other suitable downhole tools such as a steering tool, a downhole drilling motor, a downhole telemetry system, a reaming tool, a measurement while drilling tool, other logging while drilling tools, and the like. The disclosed embodiments are not limited in regards to such tool deployments.

It will be understood that the deployment illustrated on FIG. 1 is merely an example and that the disclosed embodiments are not limited to use with a semisubmersible platform 12 as depicted. Nor is the disclosure limited to while drilling operations. The disclosed embodiments are equally well suited for use with any kind of subterranean logging operation, either on or offshore, as well as any kind of conveyance, for example, including wireline, coiled tubing, or drill pipe (as in a logging while drilling operation).

Figure 2:
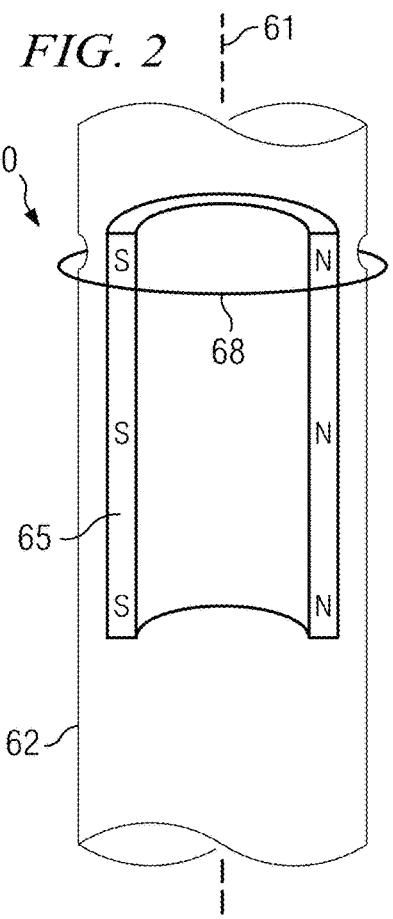
FIG. 2 depicts one example embodiment of an NMR logging tool.

FIG. 2 depicts one example embodiment of an NMR logging tool 60. In the depicted embodiment NMR tool 60 includes a substantially non-magnetic tool body 62 (e.g., a nonmagnetic drill collar in logging while drilling embodiments). A cylindrically shaped permanent magnet 65 is deployed in the tool body and may include substantially any suitable magnetic orientation (e.g., a permanent magnetization transverse to the tool axis 61 as in the depicted embodiment). NMR tool 60 further includes at least one radio frequency (RF) antenna 68 deployed in a corresponding antenna recess in the tool body 62.

It will be understood that substantially any suitable NMR tools may be employed. Such tools may include a magnetic source (e.g., a permanent magnet or an electromagnet) for generating a static magnetic field which is intended to polarize hydrogen nuclei in the subterranean formation. Suitable tools further include one or more RF antennas for transmitting and/or receiving electromagnetic radiation (e.g., AC magnetic pulses) to excite and/or detect magnetic resonance in the hydrogen nuclei in the formation. Such instrumentation is commercially available and well known in the art. For example, the CMR and MR Scanner tools available from Schlumberger Technology Corporation may be employed. Suitable NMR logging tools are also disclosed, for example, in U.S. Pat. Nos. 5,055,788 and 5,629,623.

The disclosed embodiments may also be directed to NMR evaluation of subterranean core samples. As is known to those of ordinary skill in the art, the assessment of formation characteristics acquired from formation cores is often crucial to the decision-making process concerning development plans for petroleum wells that are being evaluated as part of an exploration or production activity. These formation cores may be obtained, for example, using downhole coring tools that drill into the sidewall of the wellbore to obtain the core samples. U.S. Pat. No. 7,500,388 discloses one example of a sidewall coring tool. The formation cores may also be obtained from axial coring tools. Once acquired, the core samples may be evaluated (as described in more detail below) by positioning the sample in a laboratory NMR tool including a static magnetic source (e.g., a permanent magnet or an electromagnet) and one or more RF antennas.

Figure 3:
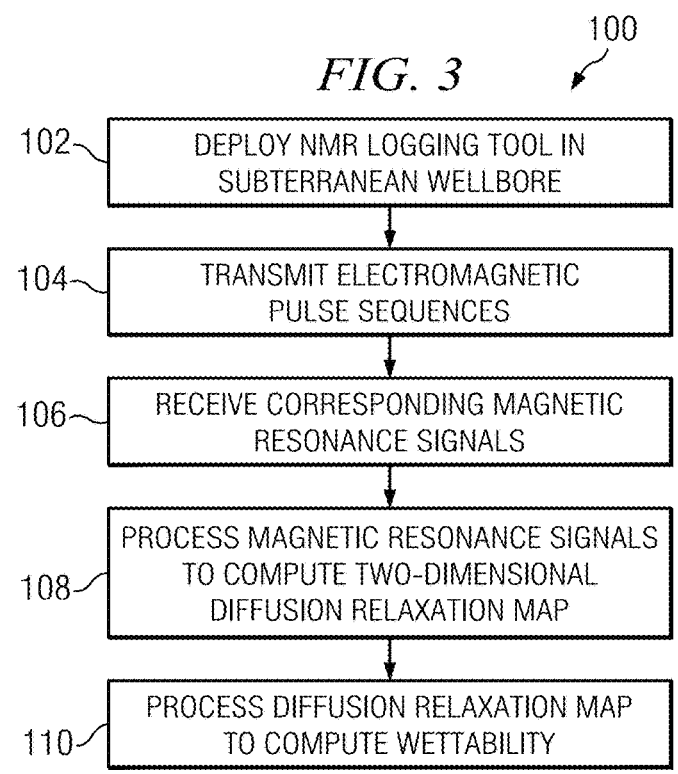
FIG. 3 depicts a flow chart of one disclosed method embodiment.

Referring now to FIG. 3, a flow chart of one disclosed method embodiment 100 for determining formation wettability is depicted. An NMR logging tool is deployed in a subterranean wellbore at 102. As described above, the NMR logging tool includes a static magnetic field source (e.g., a permanent magnet) and at least one RF antenna. The RF antenna is energized such that it transmits at least two magnetic field pulse sequences into the formation at 104. Corresponding magnetic resonance signals are received at 106 using the transmitting antenna (or another antenna). The received magnetic resonance signals (also referred to in the art as echoes) are processed at 108 to compute a two dimensional $D$-$T_2$ map, which is in turn further processed at 110 to compute a wettability of the subterranean formation (e.g., a wettability factor or a wettability index).

It will be understood that logging method 100 may include substantially any suitable logging operation, for example, including a wireline logging operation in which a wireline NMR logging tool is deployed in the wellbore at 102 or a logging while drilling operation in which an NMR logging while drilling tool is deployed in the wellbore at 102. In one preferred embodiment, the logging tool includes a logging while drilling tool and the RF energy (the electromagnetic pulse sequences) is transmitted and received at 104 and 106 at a single wellbore station (i.e., at a common measured depth) while the logging tool is stationary in the wellbore. For example, the NMR measurements may be made at 104 and 106 when a new pipe stand is added to the drill string.

While not depicted in FIG. 3, it will be understood that method 100 may further include storing the magnetic resonance signals in downhole memory. In one embodiment, the stored signals may be processed at 108 and 110 at the surface (using a surface processor or computer) after retrieving the NMR logging tool from the wellbore. The disclosed embodiments are explicitly not limited in this regard as some or all of the processing may be conducted downhole via a downhole processor (or processors) located in the drill string. Moreover, the magnetic resonance signals may be transmitted to surface, for example, via a wireline or wired drill pipe communication channel.

Figure 4:
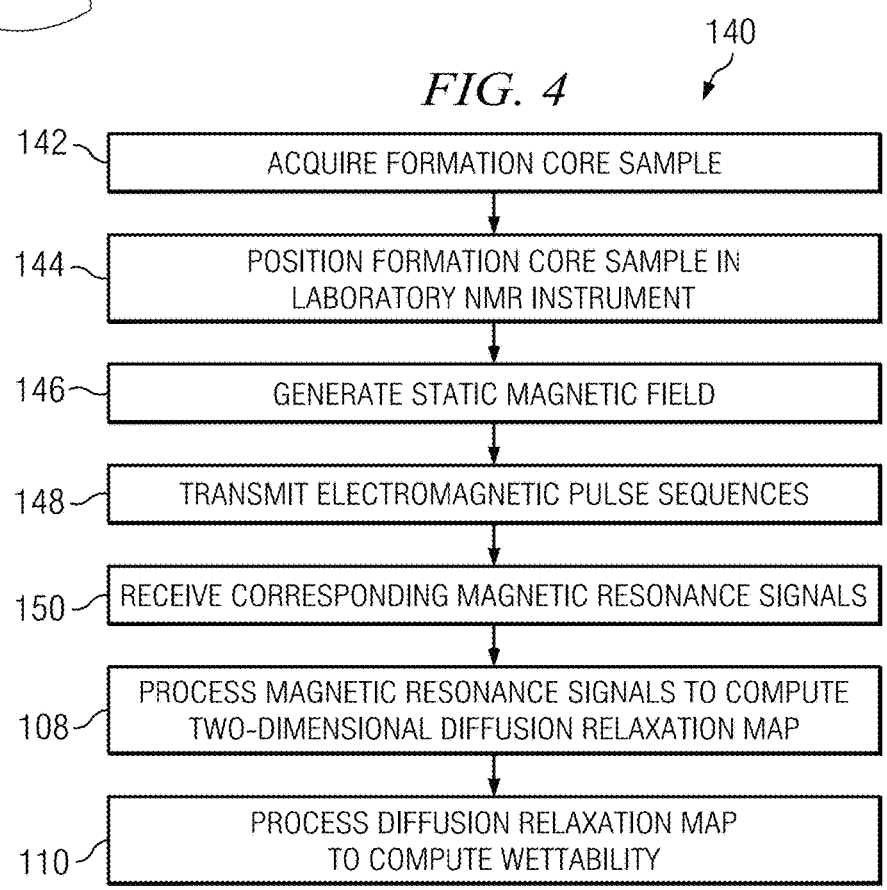
FIG. 4 depicts a flow chart of another disclosed method embodiment.

FIG. 4 depicts a flow chart of an alternative method embodiment 140 for determining the wettability of a formation core. A subterranean formation core is acquired at 142, for example, by actuating a formation coring tool in a subterranean wellbore. The formation core is retrieved to the surface and positioned in a laboratory NMR tool at 144. As described above, the laboratory NMR tool includes a static magnetic field source (e.g., a permanent magnet or an electromagnet) and at least one RF antenna. The magnetic field source is used to generate a static magnetic field which penetrates the formation core at 146. The RF antenna is then energized such that it transmits at least two electromagnetic field pulse sequences into the formation core at 148. Corresponding magnetic resonance signals are received at 150 using the transmitting antenna (or another antenna). As described above with respect to FIG. 3, the received magnetic resonance signals may then be processed at 108 to compute a two dimensional $D$-$T_2$ map, which is in turn further processed at 110 to compute a wettability of the formation core.

The formation core acquired at 142 may include substantially any suitable formation core sample. For example, the formation core may include a fresh state formation core. By fresh state it is meant that the formation core is in an "as received" condition not having undergone conventional sample preparation procedures such as extensive cleaning, oil or brine flushing or re-saturation, and/or aging with various reservoir fluids. The disclosed embodiments advantageously do not require the use of any such sample preparation procedures.

With continued reference to FIGS. 3 and 4, the wettability may be computed at 110, for example, by (i) computing effective surface relaxivity values of water and oil from the D-$T_2$ map using a generalized fluid diffusion model, (e.g., a model that includes restricted diffusion in small pores and unrestricted diffusion in large pores) and (ii) processing the surface relaxivity values of water and oil in combination to compute the wettability.

It will be understood that methods 100 and 140 involve the collection of multi-measurement NMR data to obtain the two dimensional D-$T_2$ map. To acquire such data, the RF antenna transmits a plurality of electromagnetic pulse sequences into the subterranean formation (or the formation core). A large number of corresponding echoes are received by the RF antenna (or another antenna) for each of the pulse sequences to obtain a suite of NMR measurements. The echoes may be received at a number of different wait times (WT) and inter-echo spacings (TE) with the total number of received echoes often being in the thousands. Commonly assigned U.S. Pat. Nos. 6,570,382 and 6,969,913, each of which is incorporated by reference herein in its entirety, disclose example pulse sequences that may be utilized in the present method.

As described above with respect of FIGS. 3 and 4, the received magnetic resonance signals (i.e., the echoes) may be processed to generate a diffusion relaxation map (referred to herein as a D-$T_2$ map). The D-$T_2$ map presents the received magnetic resonance signals (the spin echo data) in a two-dimensional contour plot as amplitudes versus diffusion (D) on the vertical axis and relaxation ($T_2$) on the horizontal axis. The D-$T_2$ maps may be generated, for example, via processing the received magnetic resonance signals using a two dimensional model-independent inversion code such as a maximum entropy principle (MEP) code. The use of such MEP codes may be advantageous in that no a-priori knowledge of fluid properties (such as diffusion coefficients or $T_2$ values) or even fluid types are required. U.S. Pat. Nos. 6,570,382 and 6,969,913 further disclose methods for generating the D-$T_2$ maps.

Figure 5:
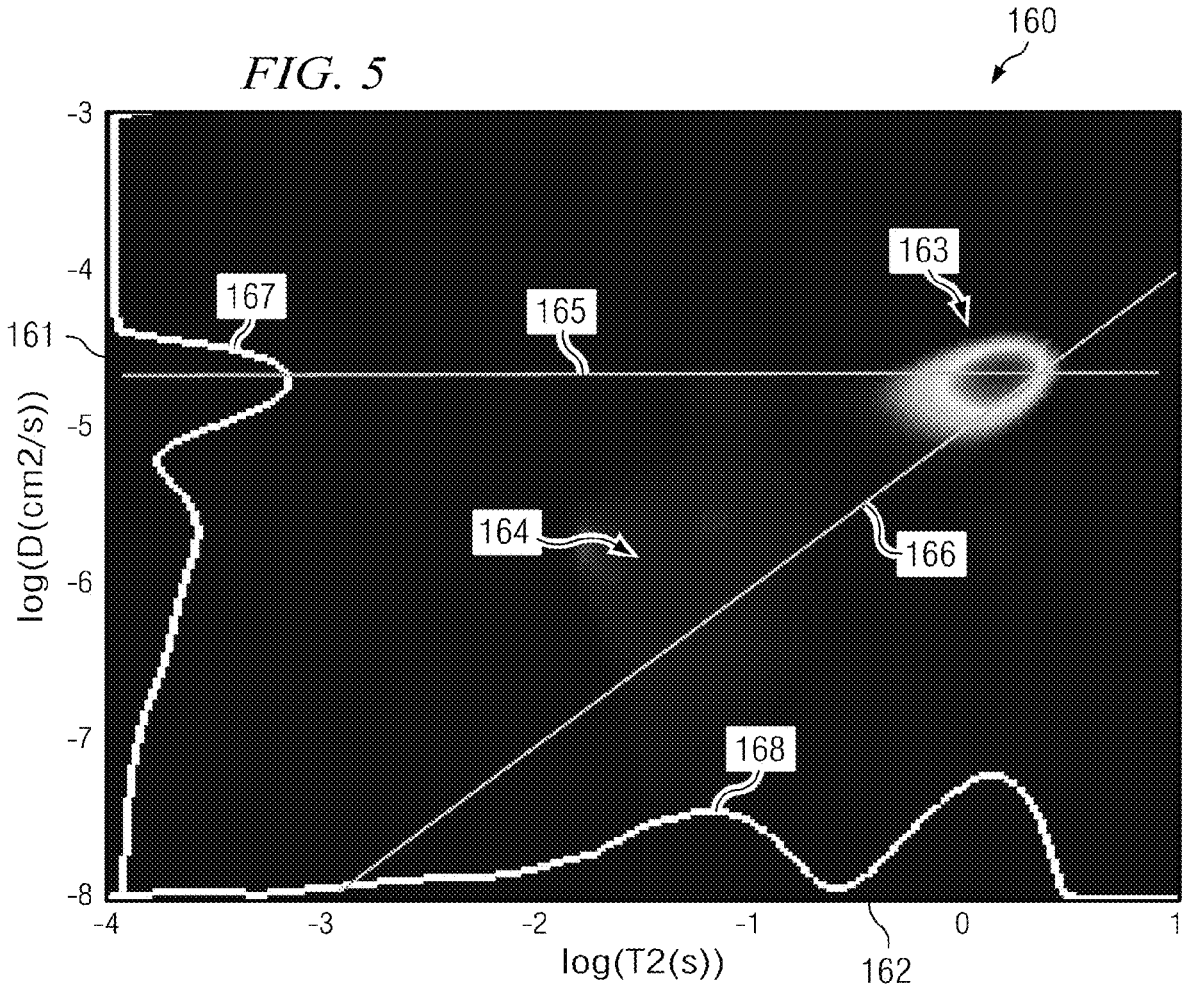
FIG. 5 depicts one example of a D-$T_2$ map generated from laboratory NMR measurements that were obtained from a formation core.

FIG. 5 depicts one example of a D-$T_2$ map 160 generated from laboratory NMR measurements that were obtained from a formation core sample. As described above, the D-$T_2$ map presents the NMR spin echo data as amplitudes versus diffusion (D) on the vertical axis 161 and relaxation ($T_2$) on the horizontal axis 162. In the depicted embodiment, the D-$T_2$ map is presented as a contour map in which the amplitudes are delineated using pseudo-colored contours. It will be understood that the D-$T_2$ map may be alternatively (and/or additionally) presented as a contour map in which the amplitudes are delineated using grey scale contours, constant amplitude contour curves, or as three-dimensional maps in which the amplitudes are depicted in the third dimension. The differences of diffusion properties among various fluids (e.g., oil, gas, or water) are captured by the D-$T_2$ map and may be evident as separate and distinct peaks. In the depicted map, first and second fluids are shown at 163 and 164. The theoretical responses of water and oil may be optionally overlaid on the maps to help the interpretation and are shown in FIG. 5 at 165 and 166. Representative one-dimensional diffusion and $T_2$ curves may also be optionally overlaid to assist interpretation and are shown at 167 and 168.

Figure 6:
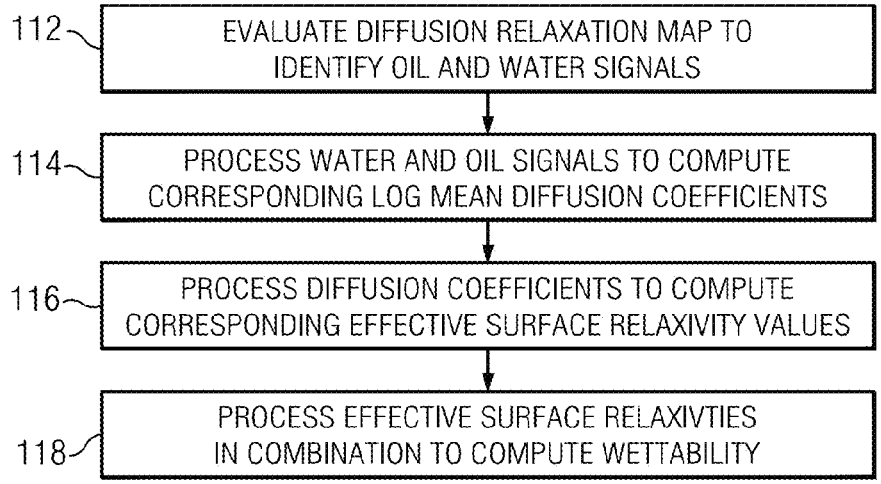
FIG. 6 depicts a flow chart of one example embodiment for processing a D-$T_2$ map to compute a wettability index value for a formation (or formation core).

FIG. 6 depicts a flow chart of one example embodiment for processing the D-$T_2$ map at 110 to compute the wettability of the formation (or formation core). For example, the map may be evaluated at 112 to identify water and oil signals in the map. The water and oil signals identified at 112 may then be processed at 114 to compute the diffusion coefficient log mean for water ($DCLM_w$) and oil ($DCLM_o$) in the formation (or formation core). The $DCLM_w$ and $DCLM_o$ values may then be further processed at 116 to compute corresponding effective surface relaxivity values of water $\rho_{eff\_w}$ and oil $\rho_{eff\_o}$. These effective surface relaxivity values may then be processed in combination (together) at 118 to compute the wettability value (e.g., W and/or IW) of the formation (or formation core).

Figure 7:
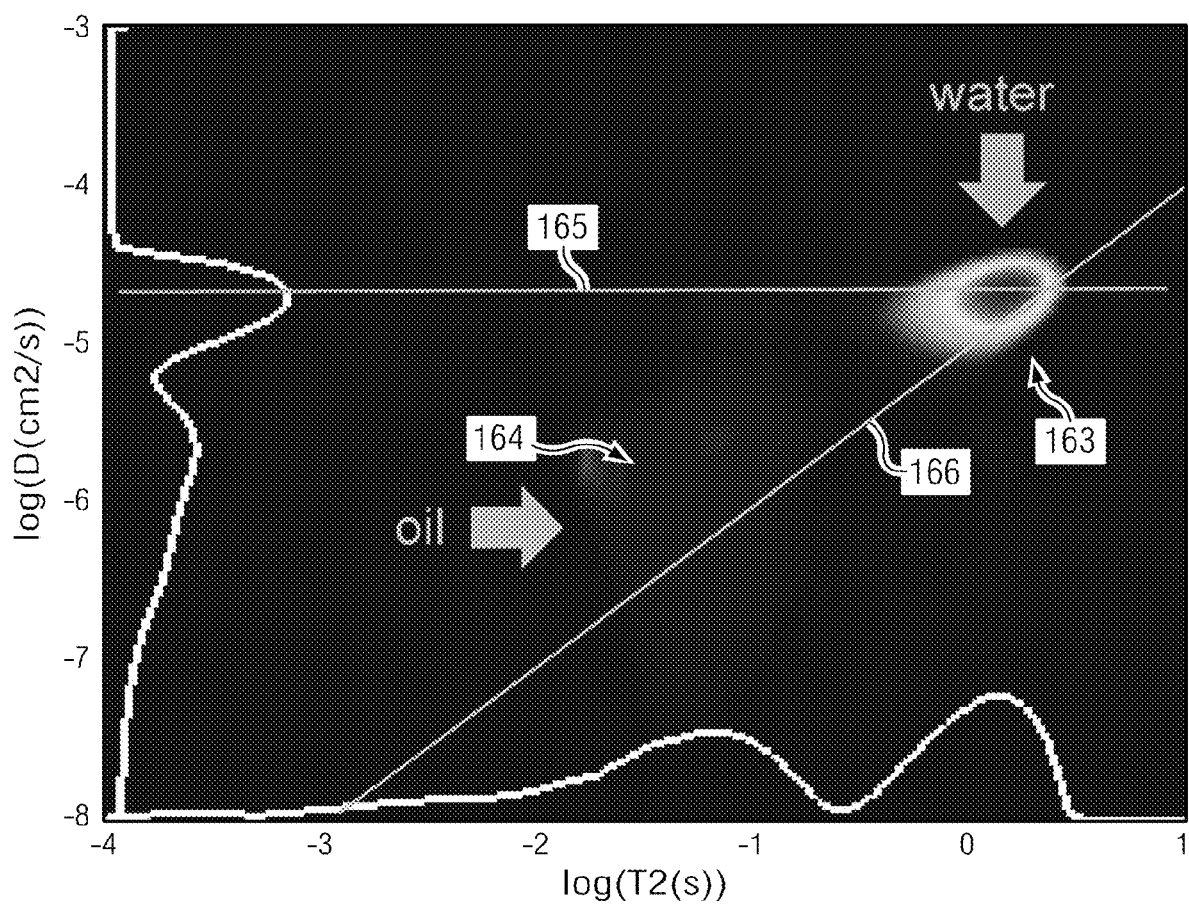
FIG. 7 depicts the D-$T_2$ map shown on FIG. 5 with identified water and oil signals.

FIG. 7 depicts the D-$T_2$ map shown on FIG. 5 with the water and oil signals identified (as described above with respect FIG. 6 at 112). The water and oil signals may be identified at 112 using substantially any suitable means, e.g., manual or automatic. For example, in FIG. 7 water signal 163 is observed to intersect the theoretical water response 165. Likewise, the oil signal 164 is observed to intersect the theoretical oil response 166.

Figure 8:
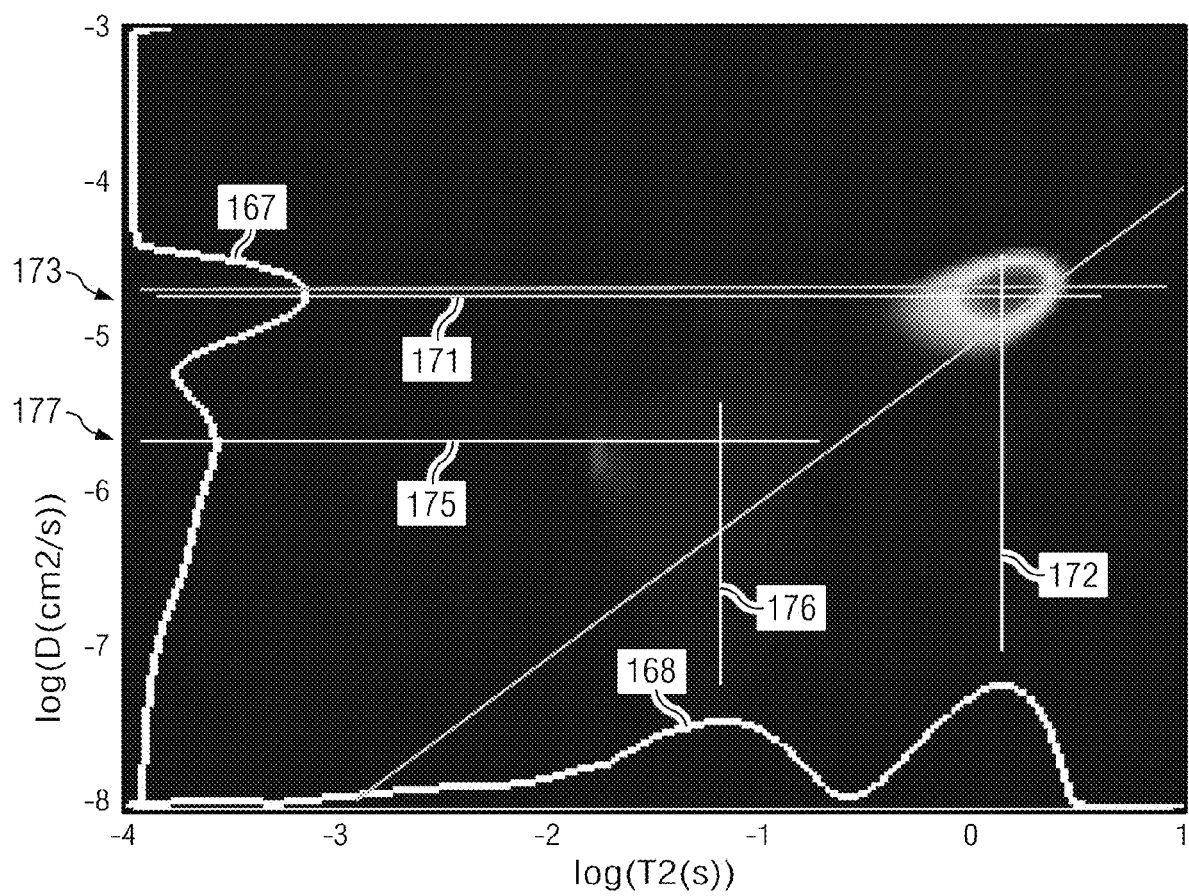
FIGS. 8 and 9 depict the D-$T_2$ map shown on FIGS. 5 and 7 further illustrating example embodiments for estimating $DCLM_w$ and $DCLM_o$.

With continued reference to FIG. 6, representative values of $DCLM_w$ and $DCLM_o$ in the water and oil signals may be estimated (or computed) at 114 from the D-$T_2$ map using substantially any suitable means. Example means are illustrated in FIG. 8 which depicts the D-$T_2$ map shown on FIGS. 5 and 7. $DCLM_w$ may be estimated, for example, by determining the diffusion value 173 at the intersection of the water peaks 171 and 172 in the overlaid diffusion and $T_2$ curves 167 and 168 as depicted. Likewise, $DCLM_o$ may be estimated, for example, by determining the diffusion value 177 at the intersection of the oil peaks 175 and 176 in the overlaid diffusion and $T_2$ curves 167 and 168 as depicted.

Figure 9:
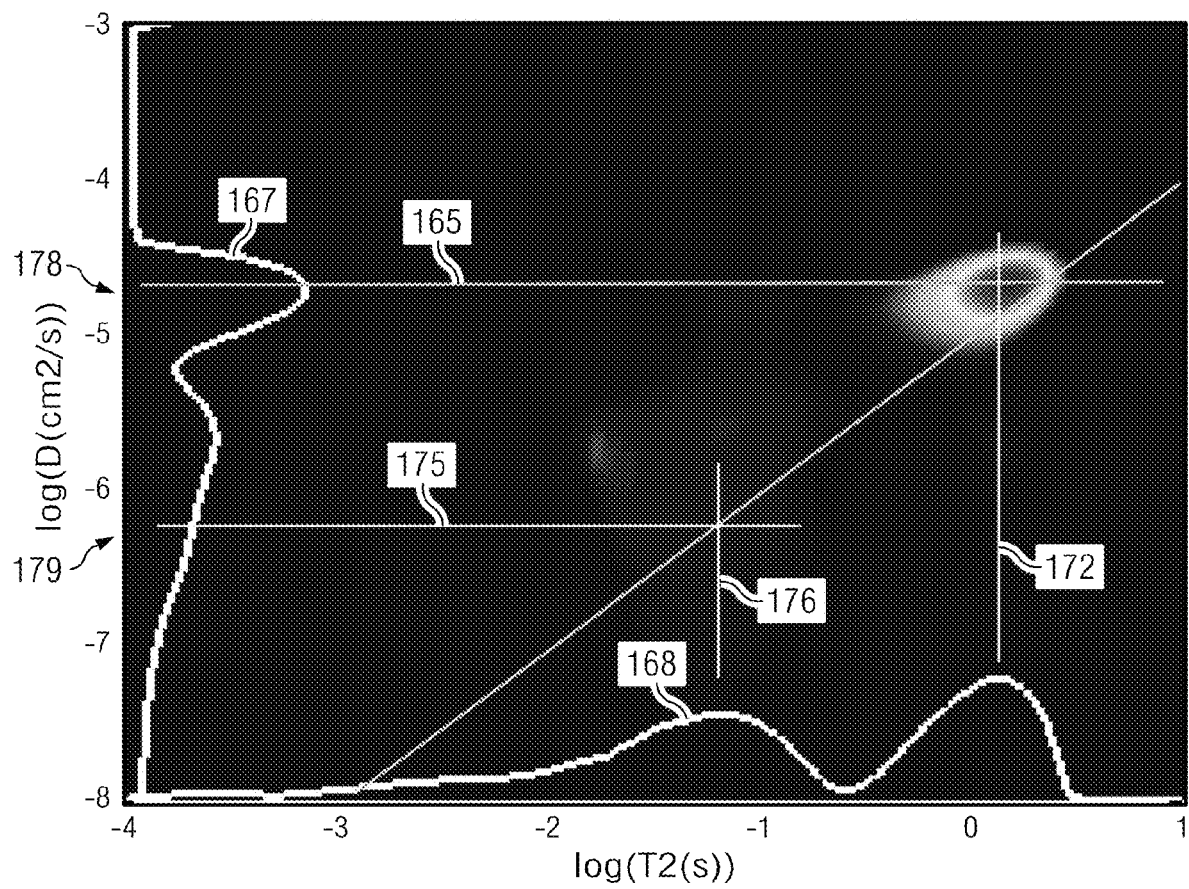

With reference to FIG. 9, $DCLM_w$ may alternatively (and/or additionally) be estimated at 114, for example, by determining the diffusion value 178 at the intersection of the water peak 172 in the overlaid $T_2$ curve 168 and the theoretical water response 165 as depicted. Likewise, $DCLM_o$ may alternative (and/or additionally) be estimated, for example, by determining the diffusion value 179 at the intersection of the oil peak 176 in the overlaid $T_2$ curve 168 and the theoretical oil response 166 as depicted.

Figure 10:
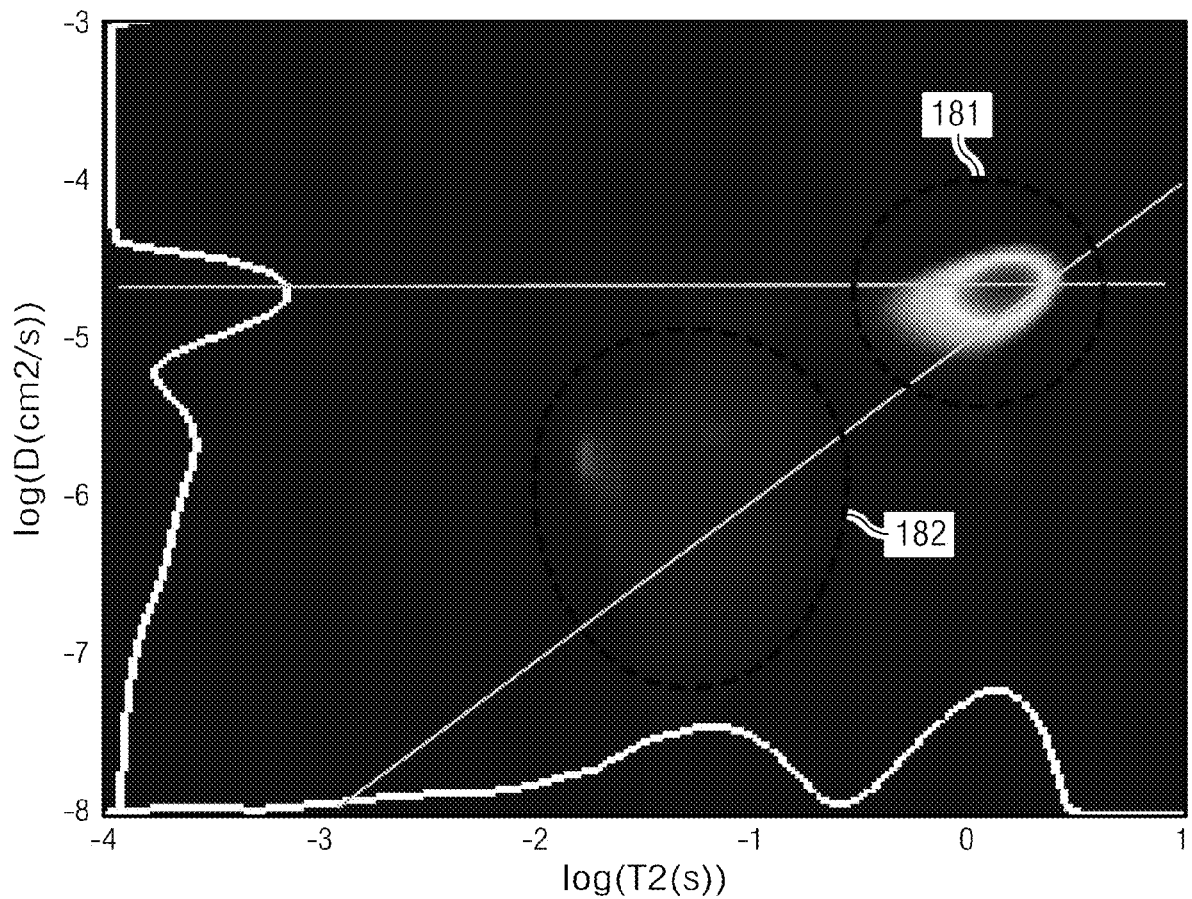
FIG. 10 depicts the D-$T_2$ map shown on FIGS. 5 and 7 and further illustrates example selected water and oil regions.

In another alternative embodiment $DCLM_w$ and $DCLM_o$ may be computed mathematically at 114 by computing the geometric mean of a diffusion distribution of amplitudes over the diffusion space about the identified water and oil signal components. For example, identifying the water and oil signals at 112 of FIG. 6 may include identifying regions about these signals. Example regions are depicted at 181 and 182 on the D-$T_2$ map shown on FIG. 10. $DCLM_w$ and $DCLM_o$ may then be computed mathematically, for example, as follows:

$$DCLM_{j\_w} = \exp\left(\frac{\sum_{i=D_{w\_min}}^{D_{w\_max}} a_i \cdot \log DC_i}{\sum_{i=D_{w\_min}}^{D_{w\_max}} a_i}\right) \quad (1)$$

$$DCLM_{j\_o} = \exp\left(\frac{\sum_{i=D_{o\_min}}^{D_{o\_max}} a_i \cdot \log DC_i}{\sum_{i=D_{o\_min}}^{D_{o\_max}} a_i}\right) \quad (2)$$

where $D_{w\text{-}min}$ and $D_{w\text{-}max}$ represent minimum and maximum water diffusion values at a first selected $T_2$ value in the water region 181 identified in 112, $D_{o\text{-}min}$ and $D_{o\text{-}max}$ represent minimum and maximum oil diffusion values at a second selected $T_2$ value in the oil region 182 identified in 112, $a_i$ represents the distribution of amplitudes at the selected $T_2$ value within the selected region 181 or 182, $DC_i$ represent the distinct diffusion coefficient values in the selected region 181 or 182, and j represents a discrete $T_2$ value with j_w representing a $T_2$ value in the water region 181 and j_o representing a $T_2$ value in the oil region 182. It will be appreciated that Equations 1 and 2 compute $DCLM_w$ and $DCLM_o$ values at corresponding distinct and discrete $T_2$ values in the water and oil regions 181 and 182. The selected $T_2$ values may include, for example, the $T_2$ values at the water and oil peaks 172 and 176 in the overlaid $T_2$ curve 168. Other $T_2$ values may also be readily selected.

In still another alternative embodiment average $DCLM_w$ and $DCLM_o$ values may be computed at 114, for example, over the entirety of the water and oil regions 181 and 182 selected at 112 of FIG. 6. These average values may be computed, for example, as follows:

$$DCLM_{a\_w} = \frac{\sum_{j=1}^{N_w} DCLM_{j\_w}}{N_w} \quad (3)$$

$$DCLM_{a\_o} = \frac{\sum_{j=1}^{N_o} DCLM_{j\_o}}{N_o} \quad (4)$$

where $DCLM_{a\_w}$ and $DCLM_{a\_o}$ represent the average $DCLM_w$ and $DCLM_o$ values, $N_w$ represents the discrete number of $T_2$ values between the minimum and maximum $T_2$ values in the water region 181, and $N_o$ represents the discrete number of $T_2$ values between the minimum and maximum $T_2$ values in the oil region 182.

In yet another embodiment, diffusion coefficient log mean curves may be defined by computing $DCLM_{j\_w}$ and $DCLM_{j\_o}$ over a discrete plurality of $T_2$ values, where j=1, 2, ... $N_w$_$N_o$.

As further described above with respect to FIG. 6, the estimated and/or computed $DCLM_w$ and $DCLM_o$ values or $DCLM_{j\_w}$ and $DCLM_{j\_o}$ curves may then be further processed at 116 to compute corresponding effective surface relaxivity values of water $\rho_{eff\_w}$ and oil $\rho_{eff\_o}$. The effective surface relaxivity values may be computed, for example, using a generalized fluid diffusion model, (e.g., a model that includes restricted diffusion in small pores and unrestricted diffusion in large pores).

As is known in the art, the time-dependent diffusion $D(t)$ of a proton in a pore space was described by Einstein in 1926 as follows:

$$D(t) \equiv \frac{\langle [x(t) - x(0)]^2 \rangle}{6t} \quad (5)$$

where the angular brackets < > denote the average of the square displacement x of the proton from its initial position at time 0 to its position at time t. More recently Mitra showed that for short times in which the diffusion length is much smaller than the pore size scale, the diffusion coefficient is reduced from its bulk value $D_o$ as follows:

$$D(t) = D_o \left( 1 - \frac{4}{9\sqrt{\pi}} \frac{\sqrt{D_o t} S}{V} \right) \quad (6)$$

where $D_o$ represents the bulk fluid diffusion and S/V represents the surface to volume ratio of the pore (and may therefore be an indicator of the pore size). In the case of mixed saturation, S and V are respectively the surface and volume of the fluid under consideration.

For long times (when the diffusion length is much larger than the pore size), the diffusion coefficient is controlled by the fluid tortuosity in the pore system, for example as follows:

$$D(t) \rightarrow D_\infty = D_o^{m-1} S_w^{n-1} \quad (7)$$

Where $D_\infty$ represents the diffusion at infinite time, represents the pore volume, m represents the cementation exponent (which is related to the tortuosity of the pore space), $S_w$ represents the water saturation, and n represents the saturation exponent.

It will be appreciated that the surface to volume ratio S/V in Equation 6 may be determined from NMR relaxation, for example, as follows:

$$1/T_2 = 1/T_{2s} + 1/T_{2b} + 1/T_{2d} \quad (8)$$

$$1/T_{2s} = \rho_{eff} \cdot S/V \quad (9)$$

where $T_{2s}$ represents the surface transverse relaxation, $T_{2b}$ represents the bulk fluid transverse relaxation, $T_{2d}$ represents the relaxation caused by diffusion, and $\rho_{eff}$ represents the effective surface relaxivity across the relaxing fraction of the fluid's interface (the percentage of the fluid in contact with the solid matrix). The effective surface relaxivity of water, $\rho_{eff\_w}$, may be expressed mathematically, for example, as follows when the rock is partially saturated:

$$\rho_{eff\_w} = \frac{I_{g,w}}{I_{g,w} + I_{o,w}} \cdot \rho_w \quad (10)$$

where $I_{g,w}$ and $I_{o,w}$ represent the grain water and oil water interfaces and $\rho_w$ represents the intrinsic surface relaxivity of water. Note that Equation 10 reduces to $\rho_{eff\_w} = \rho_w$ if the matrix is water saturated (such that all fluid interfaces are water grain interfaces).

The effective surface relaxivity of oil $\rho_{eff\_o}$ tends to be more complicated as the distributions of very viscous oils can span several decades in relaxation and diffusion time. Notwithstanding, in a narrow range of $T_2$ values the oil may be assumed to have a well-defined mean diffusion coefficient such that $\rho_{eff\_o}$ may be expressed mathematically in a similar manner to Equation 10, for example, as follows:

$$\rho_{eff\_o} = \frac{I_{g,o}}{I_{g,o} + I_{o,w}} \cdot \rho_o \quad (11)$$

where $I_{g,o}$ and $I_{o,w}$ represent the oil and oil water interfaces, and $\rho_o$ represents the intrinsic surface relaxivity of oil.

A Padé approximation may be used to connect fast and slow relaxation regimes and thereby combine Equations 6 and 7 to obtain a generalized diffusion equation, for example, as follows:

$$D(T_2) = D_o \left[ 1 - \gamma \frac{\alpha \cdot L_D + \left(\frac{L_D}{L_M}\right)^2}{\alpha \cdot L_D + \left(\frac{L_D}{L_M}\right)^2 + \gamma} \right] \quad (12)$$

where $L_D$ represents the diffusion length of the proton, $L_M$ represents the heterogeneity length scale of the medium, and $$\alpha = \frac{4}{9\sqrt{\pi}} \cdot \frac{1}{T_{2s} \cdot \rho_{eff}}$$

$$\gamma = 1 - \frac{D_o}{D_\infty} = 1 - \frac{1}{m - 1 S_W^{n-1}} \approx 1 - \frac{1}{m-1}$$

It will be appreciated that the diffusion length of the proton $L_D$ is commonly much less than the heterogeneity length scale $L_M$ such that the ratio $L_D/L_M$ is much less than 1. It will further be appreciated that the far-right expression for $\gamma$ assumes that the water saturation $S_w$ (in Equation 7) is about equal to 1. The disclosed embodiments are, of course, not limited in this regard as any saturation dependence may alternatively be regarded as a reduced porosity (pore volume)·$S_w$.

With further reference to Equation 12 it will be understood that the generalized diffusion coefficient $D(T_2)$ may be thought of as being expressed as a function of two unknown parameters, namely the effective surface relaxivity $\rho_{eff}$ and the cementation exponent m. Thus in one disclosed embodiment the $DCLM_w$ and $DCLM_o$ values estimated or computed at 114 of FIG. 6 may processed in combination with Equation 12 to compute the corresponding effective surface relaxivity values of water $\rho_{eff\_w}$ and oil $\rho_{eff\_o}$ at 116. This may be expressed mathematically, for example, as follows:

$$DCLM_w = D_o \left[ 1 - \gamma \frac{\alpha_w \cdot L_D + \left(\frac{L_D}{L_M}\right)^2}{\alpha_w \cdot L_D + \left(\frac{L_D}{L_M}\right)^2 + \gamma} \right] \quad (13)$$

$$DCLM_o = D_o \left[ 1 - \gamma \frac{\alpha_o \cdot L_D + \left(\frac{L_D}{L_M}\right)^2}{\alpha_{ow} \cdot L_D + \left(\frac{L_D}{L_M}\right)^2 + \gamma} \right] \quad (14)$$

where:

$$\alpha_w = \frac{4}{9\sqrt{\pi}} \cdot \frac{1}{T_{2s} \cdot \rho_{eff\_w}}$$

$$\alpha_o = \frac{4}{9\sqrt{\pi}} \cdot \frac{1}{T_{2s} \cdot \rho_{eff\_o}}$$

Equations 13 and 14 may be solved for $\rho_{eff\_w}$, $\rho_{eff\_o}$, and m using substantially any suitable numerical (mathematical) methods, for examples, using conventional solvers or inversion routines. One such inversion routine may involve minimizing a least squares cost function, for example, as follows:

$$\min_x \| \sum_j w_j (D(T_{2j}, x) - DCLM_j)^2 \quad (15)$$

where x is a vector (or function) of $\rho$, or of $\rho$ and m, or of $\rho$, m, $S_w$, and n (where $\rho$ represents $\rho_{eff\_w}$ or $\rho_{eff\_o}$ depending upon which effective relaxivity value is being computed), $T_{2j}$ and $DCLM_j$ represent the discrete coordinates of the diffusion coefficient log mean curves on the $D/T_2$ map, $D(T_{2j}, x)$ represents the generalized diffusion equation described above with respect to Equations 12-14, and $w_j$ represent weighting functions, e.g., the relative $T_2$ amplitudes at $T_{2j}$ with respect to the sum of the $T_2$ amplitudes. This sum may also be the fluid volume. The subscript j represents the $j^{th}$ discrete $T_2$ values in the selected water or oil regions.

It will be appreciated that the most robust inversion scenario may be to input m from some other source or measurement and solve only for $\rho$. If m is not available, it may be preferable to first solve for $\rho_{eff\_w}$ and m for the water region and then fix m to solve for $\rho_{eff\_o}$ using the oil phase, however, the disclosed embodiments are not limited in this regard.

As described above with respect to FIG. 6, the effective surface relaxivity values of water and oil $\rho_{eff\_w}$ and $\rho_{eff\_o}$ may be processed in combination at 118 to compute a wettability factor W or a wettability index value IW of the formation (or formation core). In a mixed oil/water system, the surface transverse relaxation given in Equation 9 may be expressed, for example, as follows:

$$\frac{1}{T_{2s}} = \rho_w \frac{W}{S_w} \left(\frac{S}{V}\right) \quad (16)$$

$$\frac{1}{T_{2s}} = \rho_w \frac{1}{S_o} \frac{W}{\left(\frac{S}{V}\right)} \quad (17)$$

where $T_{2S}$, $\rho_w$, $S_w$, S, and V are as defined above, $S_o$ represents the saturation of oil (which in the absence of a gas phase equals $1 - S_w$), and W represents a wettability factor (which is not necessarily the same quantity as the wettability index computed at 118). The wettability factor W is defined herein as the percentage of the total surface wetted by water such that W=1 indicates a 100% water-wet condition, and W=0 indicates a 100% oil-wet condition.

Inspection of Equations 16 and 17 leads to the concept of effective relaxivities of water and oil by grouping all the terms other than the S/V ratio into single term, for example, as follows:

$$\rho_{eff\_w} = \rho_w \frac{W}{S_w} \quad (18)$$

$$\rho_{eff\_o} = \rho_o \frac{1}{S_o} \frac{W}{} = \rho_o \frac{1}{1-S_w} W \quad (19)$$

where $\rho_{eff\_w}$ and $\rho_{eff\_o}$ represent the effective relaxivities of water and oil as defined above with respect to Equations 10 and 11.

In laboratory experiments, after cleaning, the rock is saturated with either water or oil such that $S_w=1$ or $S_o=1$, and hence, the effective relaxivity is equal to the intrinsic relaxivity of the saturating fluid for a given state of wettability of the rock. In laboratory experiments in which the rocks are successively saturated with water then oil, the respective fluids tend to plot on the theoretical water line and oil line in the $D/T_2$ map (with $S_w=1$ or $S_o=1$) such that Equations 18 and 19 may be further reduced, for example, as follows:

$$\rho_{eff\_w} = \rho_w W$$

$$\rho_{eff\_o} = \rho_R \rho_w (1 W)$$

where $\rho_R = \rho_o / \rho_w$. The wettability factor W may then be expressed, for example, as follows:

$$W = \frac{\rho_{eff\_w}}{(\rho_{eff\_w} + \rho_{eff\_o}/\rho_R)} \quad (20)$$

A wettability index IW may be expressed alternatively as the mathematical difference between the fraction of the surface wetted by water W and the fraction of surface wetted by oil 1 W, for example, as follows:

$$IW = 2W \quad 1 = \frac{(\rho_{eff\_w} \quad \rho_{\rho_{eff\_o}}/\rho_R)}{(\rho_{eff\_w} + \rho_{eff\_o}/\rho_R)} \quad (21)$$

In rocks that are partially saturated with water and oil as in the case of "fresh state" or "as received" core samples or in downhole NMR logging measurements W and IW may be expressed, for example, as follows:

$$W = \frac{\rho_{eff\_w}(S_w)}{(\rho_{eff\_w}(S_w) + \rho_{eff\_o}(S_o)/\rho_R)} \quad (22)$$

$$IW = 2W \quad 1 = \frac{(\rho_{eff\_w}(S_w) \quad \rho_{eff\_o}(S_o)/\rho_R)}{(\rho_{eff\_w}(S_w) + \rho_{eff\_o}(S_o)/\rho_R)} \quad (23)$$

where $\rho_{eff\_w}(S_w)$ indicates that $\rho_{eff\_w}$ is a function of $S_w$ and $\rho_{eff\_o}(S_o)$ indicates that $\rho_{eff\_o}$ is a function of $S_o$. It follows in situations where $\rho_{eff\_w}(S_w)$ may be approximated by the product $\rho_{eff\_w} \cdot S_w$ and where $S_w \approx S_o$, that the saturation terms cancel out in Equations 22 and 23, and that the wettability equations of the partially saturated cases are similar to those of the fully saturated cases (given in Equations 20 and 21). Thus, it may be advantageous in certain applications to make use of Equations 20 and 21 in partially saturated rocks, particularly when $S_w$ and Archie's n are highly unknown.

With respect to Equations 20-23, it will be appreciated that while W varies from 0 to 1 (from fully oil wet to fully water wet conditions) that IW varies from −1 to 1 under the same conditions.

In Equations 20-23 wettability values may be computed directly from the effective relaxivity of water and the effective relaxivity of oil as described above. In Equations 22-23 the wettability values are also related to the saturation of water and the saturation of oil in the formation (or formation core). In certain embodiments the saturation of water and the saturation of oil may also be determined directly from the D/T$_2$ map. For example, the pore volume may be computed as follows:

$$= \sum_j \sum_i a(j, i) \quad (24)$$

where a(j, i) represents the amplitude at each pixel in the map at the discrete diffusion and relaxation values (j, i). The total water and oil volumes $_w$ and $_o$ may be expressed, for example, as follows:

$$w = \sum_{j\_w} \sum_{i\_w} a(j, i) \quad (25)$$

$$o = \sum_{j\_o} \sum_{i\_o} a(j, i) \quad (26)$$

where j_w and i_w define the identified water region and j_o and i_o define the identified oil region in the D/T$_2$ map. The water and oil saturations $S_w$ and $S_o$ may then be defined as $_w/$ and $_o/$. In the absence of gases, the oil saturation $S_o$ may also be defined as 1 $S_w$.

The various disclosed embodiments are now described in further detail by way of the following example, which is intended to be an example only and should not be construed as in any way limiting the scope of the claims. Eight fresh state formation cores were obtained from a mature carbonate field. The wettability of each of the formation cores was determined using a methodology similar to method 140 described above with respect to FIGS. 4 and 6. In particular, the water and oil regions on the D/T$_2$ map were identified manually. Diffusion coefficient log mean curves for the water and oil regions were computed over a discrete plurality of T$_2$ values using Equations 1 and 2. The effective relaxivity values of water and oil were determined via minimizing a least squares cost function as described above with respect to Equation 15. A first inversion was used to solve simultaneously for the effective relaxivity of water $\rho_{eff\_w}$ and the cementation exponent m. The cementation exponent was then fixed and a second inversion was used to solve for the effective relaxivity of oil $\rho_{eff\_o}$. A wettability index was computed using Equation 23 with the water and oil saturations obtained via Equations 24 and 25 as described above. Conventional wettability values were also obtained for each of the samples using the Amott-Harvey and the U.S. Bureau of Mines methods.

Figure 11:
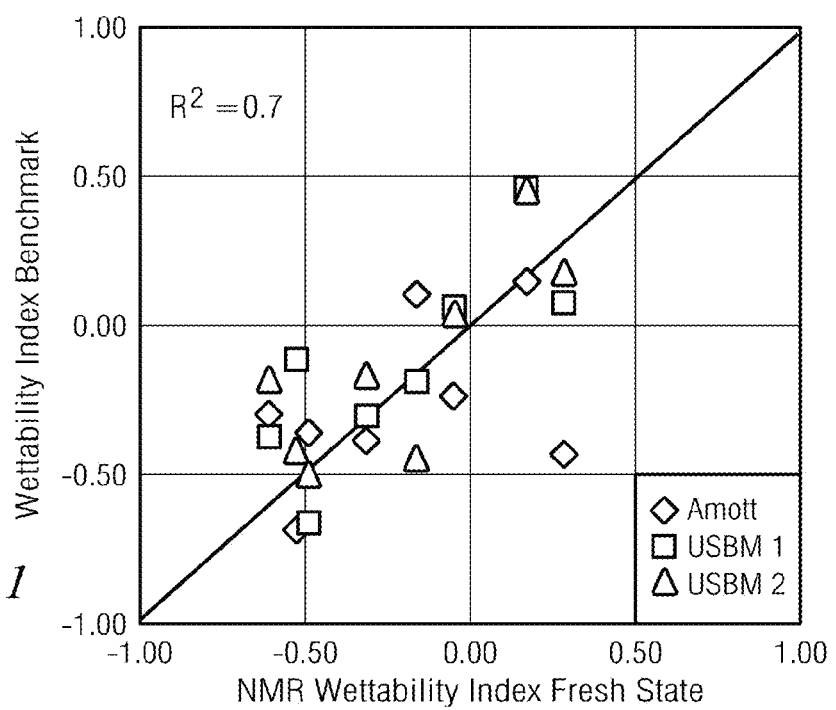
FIG. 11 depicts a plot of the wettability index benchmark and the fresh state wettability index obtained using the disclosed methodology.

FIG. 11 depicts a plot of the wettability index benchmark (obtained using the conventional methodologies) and the fresh state wettability index obtained using the disclosed methodology. The benchmark values ranged from about −0.65 (mostly oil wet) to about +0.5 (mostly water wet). Corresponding fresh state wettability index values ranged from about −0.6 to about +0.3. Moreover, a strong correlation was observed between the fresh state methodology and the U.S. Bureau of Mines methodology with a correlation of R$^2$=0.74.

Table 1 tabulates the cementation exponent m, the effective relaxivities of water $\rho_{eff\_w}$ and oil $\rho_{eff\_o}$, wettability index computed for each of the eight formation core samples. The benchmark wettability index values computed using the Amott-Harvey and the U.S. Bureau of Mines methods are also listed.

TABLE 1

| Core Sample | m | $\rho_{eff\_w}$ | $\rho_{eff\_o}$ | IW | Amott | USBM 1 | USBM 2 |
|---|---|---|---|---|---|---|---|
| 1 | 2.28 | 4.37 | 5.38 | −0.61 | −0.30 | −0.37 | −0.19 |
| 2 | 2.18 | 4.73 | 2.71 | −0.31 | −0.39 | −0.30 | −0.17 |
| 3 | 2.02 | 5.12 | 4.46 | −0.49 | −0.36 | −0.66 | −0.50 |
| 4 | 1.72 | 5.83 | 0.98 | 0.28 | −0.43 | 0.08 | 0.18 |
| 5 | 2.45 | 3.77 | 0.80 | 0.17 | 0.15 | 0.46 | 0.46 |
| 6 | 2.36 | 4.14 | 1.72 | −0.16 | 0.10 | −0.19 | −0.45 |
| 7 | 2.25 | 4.44 | 4.28 | −0.53 | −0.69 | −0.12 | −0.42 |
| 8 | 2.26 | 4.35 | 1.44 | −0.05 | −0.24 | 0.06 | 0.04 |

The observation that the disclosed methodology provides suitable wettability measurements using fresh state core samples suggests that suitable wettability measurements may also be obtained using downhole NMR measurements (e.g., as described above). One challenge in obtaining suitable wettability measurements using downhole NMR measurements may be acquiring NMR data having a sufficiently high signal to noise ratio so that the water and oil signals in the D/T$_2$ map can be distinguished. This challenge may be overcome, for example, via taking sufficient time to acquire the NMR measurements. Measurements made at a single station, for example as described above, may have a suitably high signal to noise ratio. Moreover, a-priori knowledge of the NMR relaxation properties of the formation oil may be processed in combination with the NMR resonance data to generate the D/T$_2$ map and thereby distinguish between the water and oil signals. The disclosed embodiments are, of course, not limited in these regards.

NMR based methods for obtaining formation wettability measurements and certain advantages thereof have been described in detail. It should be understood that various changes, substitutions and alternations can be made herein without departing from the spirit and scope of the disclosure as defined by the appended claims.

What is claimed is:

1. A method for determining wettability of a subterranean formation, the method comprising:
(a) deploying a nuclear magnetic resonance (NMR) logging tool in a subterranean wellbore, the logging tool including a static magnetic field source and a radio frequency (RF) antenna;
(b) causing the RF antenna to transmit first and second electromagnetic pulse sequences into the subterranean formation;
(c) receiving magnetic resonance signals at the RF antenna corresponding to said transmitted electromagnetic pulse sequences;
(d) generating, using a processor a two dimensional diffusion relaxation map based on the magnetic resonance signals received in (c); and
(e) computing, using the processor, a wettability value of the subterranean formation based on the diffusion relaxation map generated in (d) by:
processing the diffusion relaxation map to determine effective surface relaxivity values of water and oil, wherein processing the diffusion relaxation map to determine effective surface relaxivity values of water and oil comprises:
identifying water and oil signals in the diffusion relaxation map generated in (d);
estimating or computing a diffusion coefficient log mean value for each of the identified water and oil signals; and
processing the diffusion coefficient log mean values for the water and oil signals to compute the effective surface relaxivity values of water and oil; and
processing the effective surface relaxivity values of water and oil in combination to compute the wettability value of the subterranean formation.

2. The method of claim 1, wherein estimating or computing a diffusion coefficient log mean value for each of the identified water and oil signals comprises:
estimating a diffusion value at a water peak in a T$_2$ curve to obtain the diffusion coefficient log mean value for the water signal; and
estimating a diffusion value at an oil peak in a T$_2$ curve to obtain the diffusion coefficient log mean value for the oil signal.

3. The method of claim 1, wherein the diffusion coefficient log mean values for the water and oil signals are computed using the following equations:

$$DCLM_{j\_w} = \exp\left(\frac{\sum_{i=D_{w\_min}}^{D_{w\_max}} a_i \cdot \log DC_i}{\sum_{i=D_{w\_min}}^{D_{w\_max}} a_i}\right)$$

$$DCLM_{j\_o} = \exp\left(\frac{\sum_{i=D_{o\_min}}^{D_{o\_max}} a_i \cdot \log DC_i}{\sum_{i=D_{o\_min}}^{D_{o\_max}} a_i}\right)$$

wherein $DCLM_{j\_w}$ and $DCLM_{j\_o}$ represent the diffusion coefficient log mean values for the water and oil signals, $D_{w-min}$ and $D_{w-max}$ represent minimum and maximum water diffusion values in the identified water signal, $D_{o-min}$ and $D_{o-max}$ represent minimum and maximum oil diffusion values in the identified oil region, $a_i$ represents a distribution of amplitudes at a discrete $T_2$ value in the D/T$_2$ map, $DC_i$ represent distinct diffusion coefficient values in the identified water or oil region, and j represents a discrete $T_2$ value with j_w representing a $T_2$ value in the identified water region and j_o representing a $T_2$ value in the identified oil region.

4. The method of claim 1, wherein the wettability value of the subterranean formation is computed using at least one of the following equations:

$$W = \frac{\rho_{eff\_w}}{(\rho_{eff\_w} + \rho_{eff\_o}/\rho_R)}$$

$$IW = 2W - 1 = \frac{(\rho_{eff\_w} - \rho_{eff\_o}/\rho_R)}{(\rho_{eff\_w} + \rho_{eff\_o}/\rho_R)}$$

$$W = \frac{\rho_{eff\_w}(S_w)}{(\rho_{eff\_w}(S_w) + \rho_{eff\_o}(S_o)/\rho_R)}$$

$$IW = 2W - 1 = \frac{(\rho_{eff\_w}(S_w) - \rho_{eff\_o}/\rho_R)}{(\rho_{eff\_w}(S_w) + \rho_{eff\_o}/\rho_R)}$$

wherein W represents a wettability factor value and IW represents a wettability index value, $\rho_{eff\_w}$ and $\rho_{eff\_o}$ represent the effective surface relaxivity values of water and oil, $\rho_R$ represents a ratio of an intrinsic surface relaxivity of oil to an intrinsic surface relaxivity of water, and $S_w$ and $S_o$ represent water and oil saturation values.

5. The method of claim 1, wherein:
the nuclear magnetic resonance (NMR) logging tool comprises a logging while drilling tool; and
the logging while drilling tool is substantially stationary in the wellbore while causing the RF antenna to transmit first and second electromagnetic pulse sequences into the subterranean formation in (b) and receiving electromagnetic resonance signals at the RF antenna corresponding to said transmitted magnetic pulse sequences in (c).

6. The method of claim 1, further comprising:
   storing the magnetic resonance signals received in (c) in downhole memory;
   retrieving the NMR logging tool from the subterranean wellbore; and
   wherein (d) and (e) are performed at a surface location.

7. The method of claim 1, wherein the method further comprises transmitting the magnetic resonance signals received in (c) to a surface location, and the processor is a surface processor.

8. The method of claim 1, wherein the effective surface relaxivity values of water and oil are computed by minimizing a least squares cost function including a generalized fluid diffusion model.

9. The method of claim 8, wherein minimizing the least squares cost function is expressed mathematically as follows:

$$\min_{x} \| \sum_{j} w_j (D(T_{2j}, x) - DCLM_j)^2$$

wherein x is a vector of the effective surface relaxivity value of water or oil, $T_{2j}$ and $DCLM_j$ represent discrete coordinates of a diffusion coefficient log mean curve on the diffusion relaxation map, $D(T_{2j}, x)$ represents the generalized diffusion fluid model, and $w_j$ represent weighting functions.

10. A method for determining wettability of a formation core, the method comprising:
   (a) acquiring a formation core sample from a subterranean wellbore;
   (b) deploying the formation core sample in a nuclear magnetic resonance (NMR) tool, the NMR tool including a static magnetic field source and a radio frequency (RF) antenna, magnetic flux from the static magnetic field source penetrating the formation core sample;
   (c) causing the RF antenna to transmit first and second electromagnetic pulse sequences into the formation core sample;
   (d) receiving magnetic resonance signals at the RF antenna corresponding to the electromagnetic pulse sequences transmitted in (c);
   (e) generating, using a processor, a two dimensional diffusion relaxation map based on the magnetic resonance signals received in (d);
   (f) computing, using the processor, a wettability value of the formation core sample based on the diffusion relaxation map generated in (e) by:
   processing the diffusion relaxation map to determine effective surface relaxivity values of water and oil, wherein processing the diffusion relaxation map to determine effective surface relaxivity values of water and oil comprises:
   identifying water and oil signals in the diffusion relaxation map generated in (e);
   estimating or computing a diffusion coefficient log mean value for each of the identified water and oil signals;
   processing the diffusion coefficient log mean values for the water and oil signals to compute corresponding effective surface relaxivity values of water and oil; and
   processing the effective surface relaxivity values of water and oil in combination to compute the wettability value of the formation core.

11. The method of claim 10, wherein estimating or computing a diffusion coefficient log mean value for each of the identified water and oil signals comprises:
   estimating a diffusion value at a water peak in a $T_2$ curve to obtain the diffusion coefficient log mean value for the water signal; and
   estimating a diffusion value at an oil peak in a $T_2$ curve to obtain the diffusion coefficient log mean value for the oil signal.

12. The method of claim 10, wherein the diffusion coefficient log mean values for the water and oil signals are computed using the following equations:

$$DCLM_{j\_w} = \exp\left( \frac{\sum_{i=D_{w\_min}}^{D_{w\_max}} a_i \cdot \log DC_i}{\sum_{i=D_{w\_min}}^{D_{w\_max}} a_i} \right)$$

$$DCLM_{j\_o} = \exp\left( \frac{\sum_{i=D_{o\_min}}^{D_{o\_max}} a_i \cdot \log DC_i}{\sum_{i=D_{o\_min}}^{D_{o\_max}} a_i} \right)$$

wherein $DCLM_{j\_w}$ and $DCLM_{j\_o}$ represent the diffusion coefficient log mean values for the water and oil signals, $D_{w-min}$ and $D_{w-max}$ represent minimum and maximum water diffusion values in the identified water signal, $D_{o-min}$ and $D_{o-max}$ represent minimum and maximum oil diffusion values in the identified oil region, $a_i$ represents a distribution of amplitudes at a discrete $T_2$ value in the $D/T_2$ map, $DC_i$ represent distinct diffusion coefficient values in the identified water or oil region, and j represents a discrete $T_2$ value with j_w representing a $T_2$ value in the identified water region and j_o representing a $T_2$ value in the identified oil region.

13. The method of claim 10, wherein the wettability value of the subterranean formation is computed using at least one of the following equations:

$$W = \frac{\rho_{eff\_w}}{(\rho_{eff\_w} + \rho_{eff\_o}/\rho_R)}$$

$$IW = 2W - 1 = \frac{(\rho_{eff\_w} - \rho_{eff\_o}/\rho_R)}{(\rho_{eff\_w} + \rho_{eff\_o}/\rho_R)}$$

$$W = \frac{\rho_{eff\_w}(S_w)}{(\rho_{eff\_w}(S_w) + \rho_{eff\_o}(S_o)/\rho_R)}$$

$$IW = 2W - 1 = \frac{(\rho_{eff\_w}(S_w) - \rho_{eff\_o}/\rho_R)}{(\rho_{eff\_w}(S_w) + \rho_{eff\_o}/\rho_R)}$$

wherein W represents a wettability factor value and IW represents a wettability index value, $\rho_{eff\_w}$ and $\rho_{eff\_o}$ represent the effective surface relaxivity values of water and oil, $\rho_R$ represents a ratio of an intrinsic surface relaxivity of oil to an intrinsic surface relaxivity of water, and $S_w$ and $S_o$ represent water and oil saturation values.

14. The method of claim 10, wherein the effective surface relaxivity values of water and oil are computed by minimizing a least squares cost function including a generalized fluid diffusion model.

15. The method of claim 14, wherein minimizing the least squares cost function is expressed mathematically as follows:

$$\min_x \|\sum_j w_j(D(T_{2j}, x) - DCLM_j)^2$$

wherein x is a vector of the effective surface relaxivity value of water or oil, $T_{2j}$ and $DCLM_j$ represent discrete coordinates of a diffusion coefficient log mean curve on the diffusion relaxation map, $D(T_{2j}, x)$ represents the generalized diffusion fluid model, and $w_j$ represent weighting functions.

* * * * *